(12) United States Patent (10) Patent No.: US 7,525,471 B2
Prodić et al. (45) Date of Patent: Apr. 28, 2009

(54) WIDE-INPUT WINDOWED NONLINEAR ANALOG-TO-DIGITAL CONVERTER FOR HIGH-FREQUENCY DIGITALLY CONTROLLED SMPS

(75) Inventors: Aleksandar Prodić, Toronto (CA); Zdravko Lukić, Toronto (CA)

(73) Assignee: EXAR Corporation, Fremont, CA (US)

( * ) Notice: Subject to any disclaimer, the term of this patent is extended or adjusted under 35 U.S.C. 154(b) by 0 days.

(21) Appl. No.: 12/034,584

(22) Filed: Feb. 20, 2008

(65) Prior Publication Data

US 2008/0204296 A1 Aug. 28, 2008

Related U.S. Application Data

(60) Provisional application No. 60/892,126, filed on Feb. 28, 2007.

(51) Int. Cl.
*H03M 1/60* (2006.01)
(52) U.S. Cl. ...................... 341/157; 341/155
(58) Field of Classification Search ............ 341/157, 341/155, 118, 120; 327/269, 271, 261
See application file for complete search history.

(56) References Cited

U.S. PATENT DOCUMENTS

| | | | |
|---|---|---|---|
| 3,818,339 A * | 6/1974 | Black ..................... | 324/140 R |
| 6,507,171 B2 | 1/2003 | Ruha et al. | |
| 6,850,178 B2 * | 2/2005 | Watanabe ................ | 341/155 |
| 6,867,604 B2 | 3/2005 | Haldeman et al. | |
| 7,106,234 B2 * | 9/2006 | O'Connell et al. ......... | 341/144 |
| 7,330,144 B2 * | 2/2008 | Terazawa et al. ........... | 341/157 |
| 2002/0172112 A1 | 11/2002 | Shoji et al. | |
| 2005/0062482 A1 | 3/2005 | Vincent et al. | |
| 2007/0076831 A1 * | 4/2007 | Griffin ..................... | 375/360 |

OTHER PUBLICATIONS

Internationl Search Report for PCT/US08/55030, dated Jul. 28, 2008, 7 pages.

* cited by examiner

*Primary Examiner*—Peguy JeanPierre
(74) *Attorney, Agent, or Firm*—Fliesler Meyer LLP

(57) ABSTRACT

In embodiments, a new analog-to-digital converter (ADC) architecture can be used with switch-mode power supplies (SMPS) operating at switching frequencies higher than 10 MHz. Analog-to-digital converter embodiments can achieve very low power consumption, fast conversion time, and can be implemented with a simple hardware. Another noteworthy benefit is that certain ADC embodiments feature a non-linear gain characteristic that provides improved load transient response for digital controllers.

10 Claims, 4 Drawing Sheets

WIDE-INPUT WINDOWED NONLINEAR ANALOG-TO-DIGITAL CONVERTER FOR HIGH-FREQUENCY DIGITALLY CONTROLLED SMPS

CLAIMS OF PRIORITY

This application claims priority to U.S. Provisional Application No. 60/892,126, entitled "WIDE-INPUT WINDOWED NONLINEAR ANALOG-TO-DIGITAL CONVERTER FOR HIGH-FREQUENCY DIGITALLY CONTROLLED SMPS" by Prodić et al., filed on Feb. 28, 2007.

COPYRIGHT NOTICE

A portion of the disclosure of this patent document contains material that is subject to copyright protection. The copyright owner has no objection to the facsimile reproduction by anyone of the patent document or the patent disclosure, as it appears in the U.S. Patent and Trademark Office patent file or records, but otherwise reserves all copyright rights whatsoever.

FIELD OF THE INVENTION

The invention relates generally to switch-mode power supplies (SMPS) circuits, and more particularly to a wide-input windowed nonlinear analog-to-digital converter for high-frequency digitally controlled SMPS.

BACKGROUND

Digital control offers attractive features that can result in significant enhancements of low-power switch-mode power supplies (SMPS). Digital realization allows development of new control techniques that increase overall efficiency of power stage through multimode operation, enable active monitoring of SMPS parameters and subsequent auto-tuning and improve transient response by avoiding gain and parameter variation problems characteristic for analog implementations or using nonlinear control techniques. Also, with the support of automated design tools and hardware description languages (HDL), digital systems can be designed in a short time and easily modified. These tools also allow simple transfer of the designs from one implementation technology to another, i.e.: design portability. This is a highly desirable feature in modern IC design where the chip implementation technologies are changing constantly.

In spite the fact that all of these characteristics are very suitable for low-power applications, in miniature battery-powered devices such as mobile phones, PDA-s, and MP3 players, PWM analog controlled SMPS are almost exclusively used. This is mostly due to the absence of low-power digital architectures that can support operation at constant switching frequencies significantly higher than 1 MHz. The power consumption of the existing digital controllers is often comparable to that of the supplied low-power electronic loads resulting in a poor overall efficiency of the SMPS. At higher switching frequencies the analog controllers take much less power, and consequently are more suitable solution, even though they do not posses most of the abovementioned features. One of the main limitations to maximum switching frequency at which digital controllers can be effectively used in low-power applications is analog-to-digital converter (ADC). Conventional high-speed ADC architectures are usually not suitable solutions.

One problem with conventional ADCs used in low-power dc-dc converters is their poor utilization in terms of performance. Conventional devices usually operate only around one operating point, corresponding to the output voltage of the power stage, which is usually constant.

BRIEF DESCRIPTION OF THE DRAWINGS

Preferred Embodiment(s) of the present invention will be described in detail based on the following figures, wherein.

DETAILED DESCRIPTION

In embodiments, a new analog-to-digital converter (ADC) architecture can be used with switch-mode power supplies (SMPS) operating at switching frequencies higher than 10 MHz. Analog-to-digital converter embodiments can achieve very low power consumption, fast conversion time, and can be implemented with a simple hardware. Another noteworthy benefit is that certain ADC embodiments feature a non-linear gain characteristic that provides improved load transient response for digital controllers. This solution can also allow for operation with low input voltages.

In an embodiment, an ADC combining dual differential input stage, delay lines and nonlinear error logic is provided. The ADC embodiment allows operation with input voltages as low as zero volts and has quantization steps and conversion time independent of the operating point. The nonlinear error logic additionally improves dynamic response by creating non-uniform quantization steps that increase gain of the ADC for non-zero output voltage errors. An ADC embodiment includes a new architecture designed in 0.18-μm CMOS process and tested through simulations. Embodiments employing this digital architecture can enable control of upcoming switching converters that are likely to operate at switching frequencies beyond 100 MHz.

Figure 1:
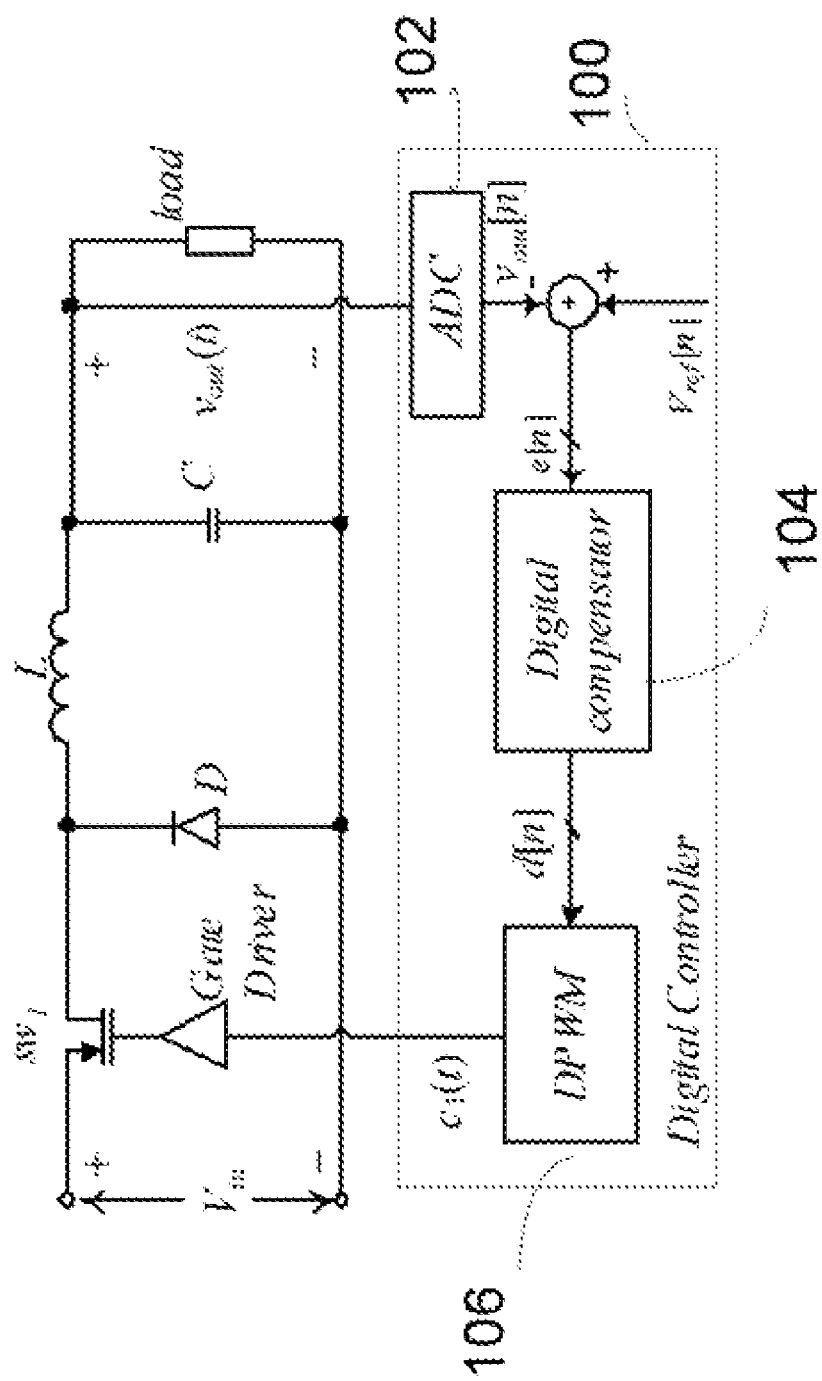
FIG. 1 illustrates an example of a digitally controlled dc-dc buck converter embodiment for the case when pulse-width modulation (PWM) is used to regulate the output voltage.

FIG. 1 illustrates an example of a digitally controlled dc-dc buck converter embodiment for the case when pulse-width modulation (PWM) is used to regulate the output voltage. As shown in FIG. 1, the digital controller 100 comprises of an ADC 102, a digital compensator 104, and a digital pulse-width modulator (DPWM) 106.

The ADC 102 converts the analog value of the power stage output voltage, $v_{out}(t)$, into its digital equivalent $v_{out}[n]$. Based on the digital reference value $V_{ref}$ a digital error signal e[n] is formed. This error is then processed by the digital compensator 104 that produces digital variable d[n]. Based on d[n] the digital-pulse width modulator (DPWM) 106 produces a pulse-width modulated analog signal c(t) that regulate operation of the solid-state switch $sw_1$. The frequency of c(t), i.e.: switching frequency fsw=1/Ts, in this type of implementation can be constant.

To satisfy requirements for tight output voltage regulation and fast dynamic response the ADC should be able to perform conversion accurately, inside one switching cycle. Meaning that in a SMPS converter operating at 10 MHz, the ADC should be able to perform conversion in less then 100 ns. In general, such ADCs are complex, require large on-chip area, and take significant amount of power. Consequently, they are not suitable for implementation in low-power SMPS operating at high-switching frequencies.

Figure 2:
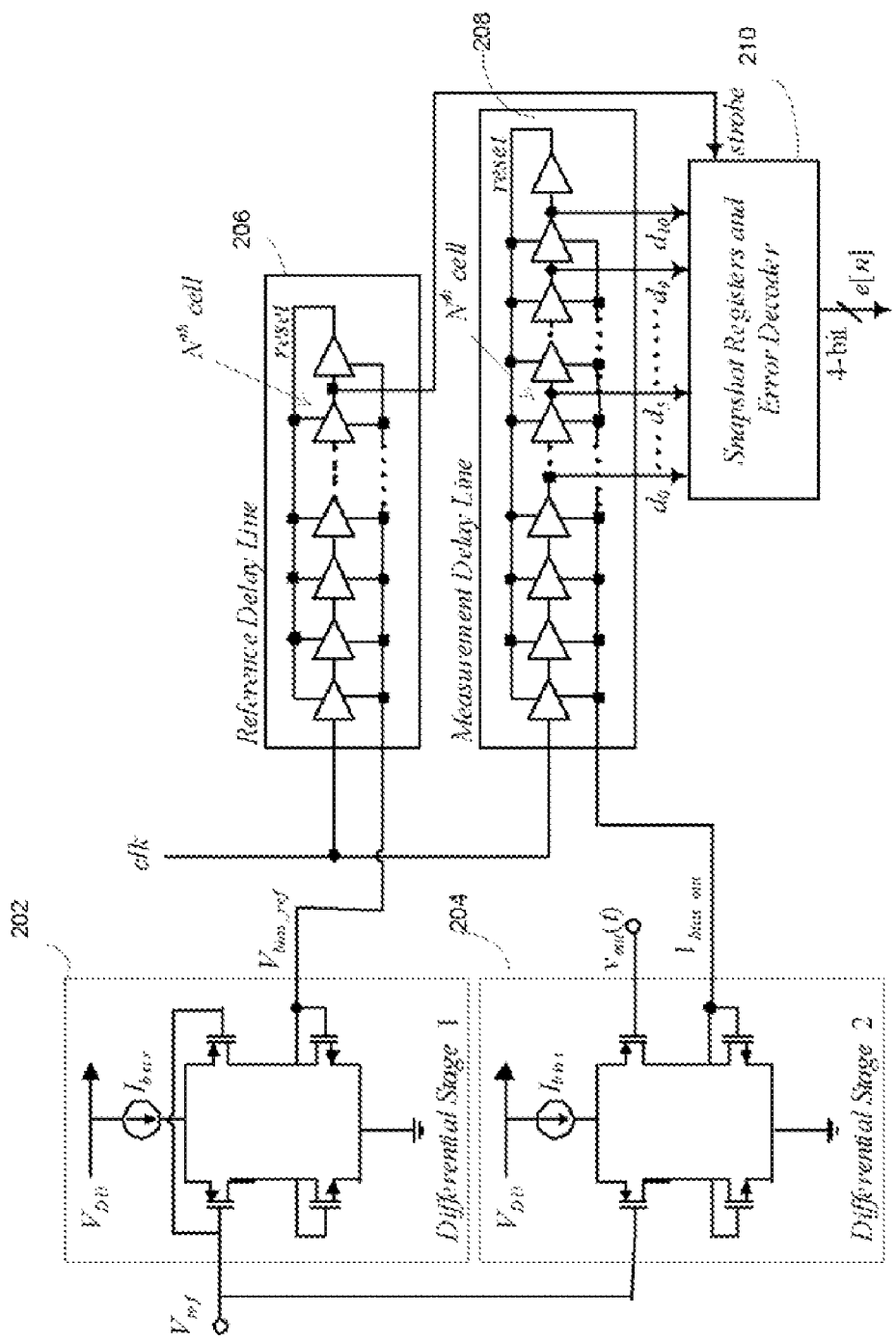
FIG. 2 illustrates a block diagram of an ADC in an embodiment.

FIG. 2 illustrates a block diagram of an ADC in an embodiment. Two input differential stages 202, 204 are used to provide bias voltages for a reference voltage delay line 206 and a voltage measurement delay line 208, each containing different numbers of identical current-starved delay cells. The voltage measurement line contains five more cells than the reference line. An output voltage error is measured by comparing propagation times of a clock signal (CLK) through the delay lines 206, 208. Both delay lines are triggered simultaneously, with the rising edge of CLK signal initiating movement of two pulses through them. When the pulse propagating through the reference delay line reaches $N^{th}$ delay cell, a strobe signal is created and a snapshot of the measured delay line is taken. Then, based on the number of cells CLK signal has propagated through, an error decoder 210 determines e[n], digital equivalent of output voltage error and sends it to the digital compensator 104 of FIG. 1.

Two differential stages 202, 204, as illustrated in FIG. 2, allow operation with low input voltages and provide the ADC characteristics independent of $V_{ref}$. It can be seen that $V_{bias\_ref}$, the output of P-MOS differential stage 202 is unchanged for $V_{ref}$ ranging from zero volts to maximum input value limited with VDD, threshold voltages of P-MOS transistors, and current biasing circuit. The voltage of the differential stage 204 regulating propagation through measurement delay line can be described according to the relationship (1):

$$V_{bias\_out} = V_{bias\_ref} + K(V_{ref} - V_{out}(t)) = V_{bias\_ref} - Ke_v(t) \tag{1}$$

where, $e_v(t)$ is output voltage error and K is a constant that depends on $I_{bias}$ and the sizing of the transistors in differential stages 202, 204 as well as on the construction of delay cells in delay lines 206, 208. The equation in relationship (1) shows that the difference in propagation times through two delay lines 206, 208 only depends on the voltage difference and is not influenced by the changes of $V_{ref}$.

In this structure both conversion speed and quantization steps depend on $I_{bias}$ and the construction of delay cells. This means that ADC embodiments can provide more functions such as dynamic variation of quantization steps, and variable conversion time can be added by replacing currently used current-starved delay cells with digitally programmable ones shown in FIG. 3A. In an embodiment, to further reduce power consumption it would be possible to shut down the current bias circuit after the ADC conversion is completed and activate it again with the new rising edge of the clock signal.

In embodiments, non-linear quantization steps are utilized to introduce variable gain and improve controller transient response without causing limit cycle oscillations. In digitally controlled SMPS it is usually desirable to limit the minimum size of the ADC's input voltage quantization step resulting in zero error value, i.e. limit the width of zero error $b_{in}$. If quantization step (delta)Vq is too small higher DPWM resolution is required to eliminate possible limit cycle oscillations. On the other hand, outside the zero error $b_{in}$ larger steps result in lower sensitivity to output voltage variations and reduced loop gain caused by nonlinear quantization effects.

Figure 3A:
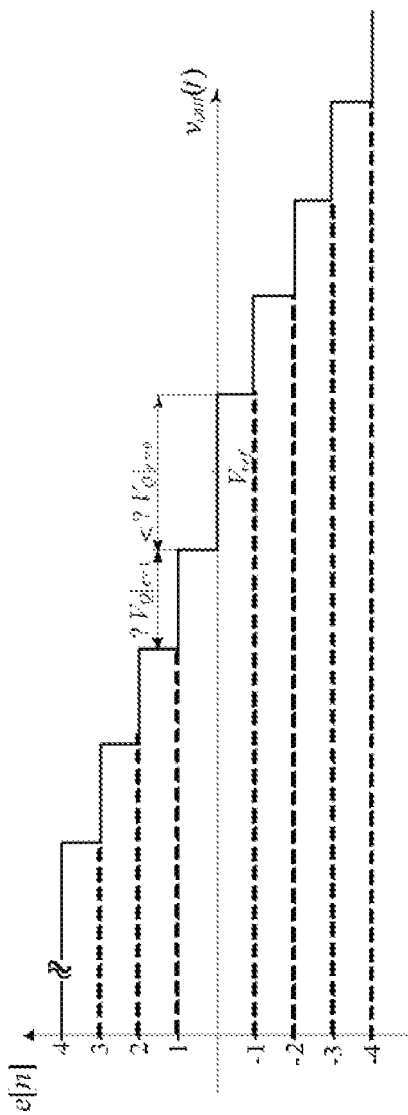
FIG. 3A illustrates an input-output characteristic of an ADC embodiment.

FIG. 3A illustrates an input-output characteristic of an ADC embodiment. As shown in FIG. 3A, the zero error $b_{in}$ is larger than the other quantization steps corresponding to significant difference between $V_{ref}$ and converter output voltage. As a result, the gain of the ADC, which is defined as shown in relationship (2):

$$K_{ADC} = \frac{\Delta e[n]}{\Delta V_Q} \tag{2}$$

is made to be larger for non-zero values and a nonlinear gain characteristic is created.

Figure 3B:
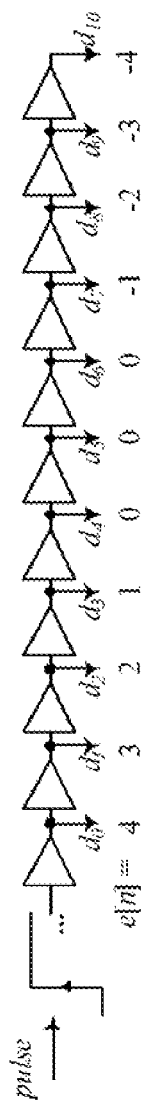
FIG. 3B illustrates a nonlinear ADC characteristic implementation in an embodiment.

FIG. 3B illustrates a nonlinear ADC characteristic implementation in an embodiment. It shows output values of the error decoder for different snapshots of the measurement delay line taken at the end of conversion process. Assigning zero error value to three different snapshots of the measurement line creates the non-linearity. As shown in FIG. 3B, it is assumed that e[n] is zero if the pulse propagating through measurement line goes through the same number of cells as the one moving through the reference line, or if the difference in the number of cells signals have propagated through is not larger than one.

System Verification

Figure 4:
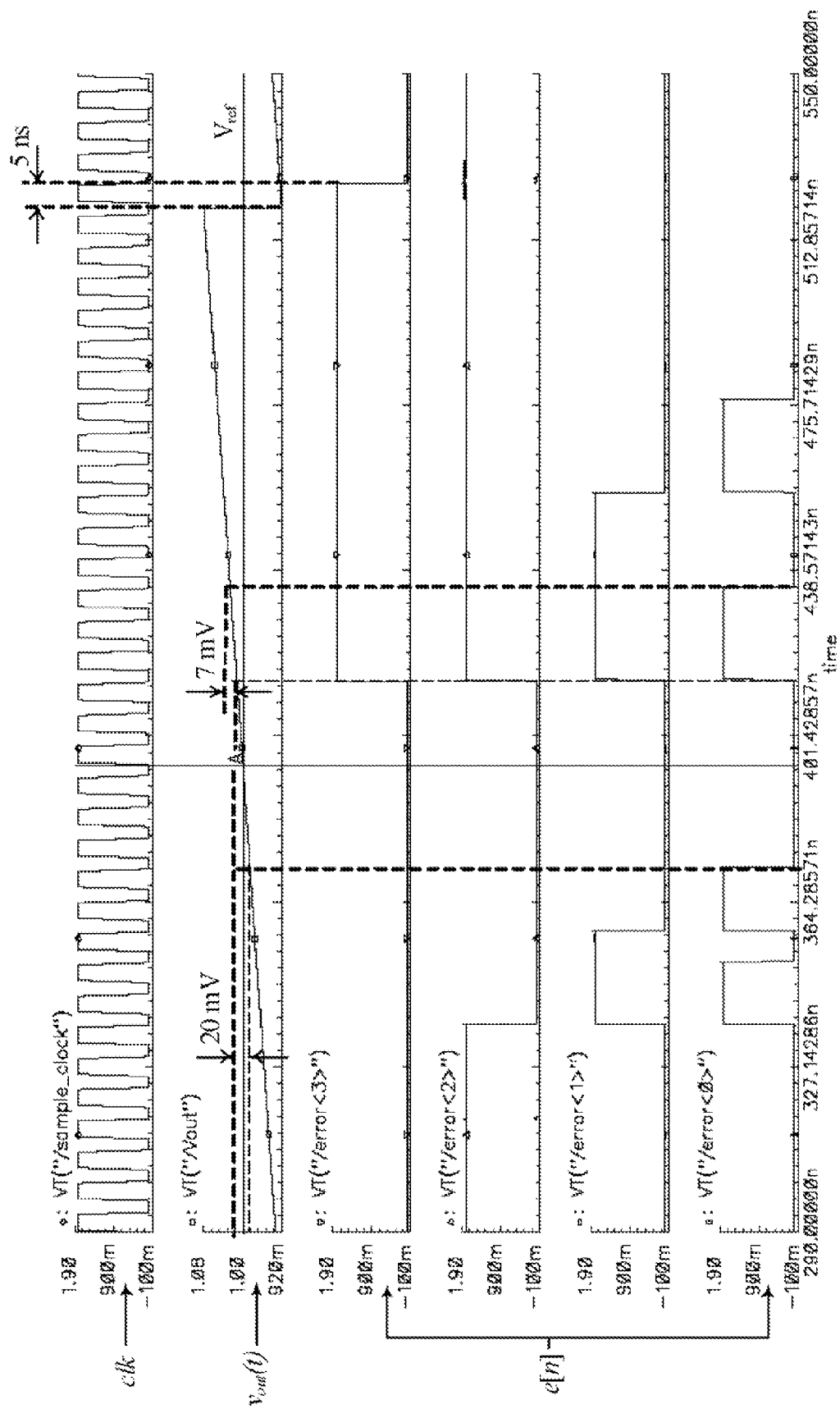
FIG. 4 illustrates simulation results demonstrating operation of a nonlinear ADC embodiment having a clock signal frequency of 150 MHz.

An ADC embodiment is implemented as an application specific integrated circuit (ASIC) and designed in 0.18 μm CMOS process. FIG. 4 shows the results of HSPICE simulation of the design adjusted for operation at switching frequency of 150 MHz.

FIG. 4 illustrates simulation results demonstrating operation of a nonlinear ADC embodiment having a clock signal frequency of 150 MHz. The waveforms show how the ramping change of switching converter output voltage, $v_{out}(t)$, around 1V reference influences ADC's output, i.e., error e[n]. It can be seen that e[n] also ramps from the binary value −4 to +4, for 80 mV effective change of the converter input voltage. Non-uniform quantization steps described in the previous section can also be observed. The zero error $b_{in}$ of this ADC is around 20 mV, approximately three times larger than the step corresponding to e[n]=−1. Simulations also verify fast analog-to-digital conversion. It can be seen that the subject ADC embodiment needs only 5 ns to react to an abrupt voltage change and convert analog signal into its digital equivalent. The current consumption is about 950 μA (7 μh/MHz).

These results verify that proposed architecture can provide an effective digital control solution for the fastest switching power converters available, as well as for upcoming systems expected to operate at frequencies beyond 100 MHz The foregoing description of the present invention has been provided for the purposes of illustration and description. It is not intended to be exhaustive or to limit the invention to the precise forms disclosed. Many modifications and variations will be apparent to the practitioner skilled in the art. Particularly, it will be evident that the above-described features of detecting and ranking images with numerical ranks in order of usefulness based on vignette score can be incorporated into other types of software applications beyond those described. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalents.

What is claimed is:

1. An Analog-to-Digital Converter (ADC) circuit comprising:

a first differential input stage and a second differential input state to receive input voltages as low as zero volts and to produce a reference bias voltage and an output bias voltage;

a reference delay line to receive the reference bias voltage and an output measurement delay line to receive the output bias voltage, each containing different numbers of delay cells; and an error decoder to determine an output voltage error by comparing propagation times of a clock signal (CLK) through the reference delay line and the output measurement delay line and send a digital equivalent of the output voltage error to a digital compensator.

2. The circuit of claim 1, wherein the reference delay line and the output measurement delay line are triggered simultaneously, with the rising edge of CLK signal initiating movement of two pulses through them.

3. The circuit of claim 1, wherein a strobe signal is created and a snapshot of the measured delay line is taken when a pulse propagating through the reference delay line reaches an $N^{th}$ delay cell.

4. The circuit of claim 3, wherein the error decoder determines e[n], a digital equivalent of output voltage error, based on the number of cells the clock (CLK) signal has propagated through.

5. The circuit of claim 1, wherein the delay cells in at least one of the reference delay line and the output measurement delay line are digitally programmable to vary conversion time.

6. The circuit of claim 1, wherein the delay cells in at least one of the reference delay line and the output measurement delay line are digitally programmable to dynamically vary quantization steps.

7. The circuit of claim 1, wherein the ADC is powered down after conversion to reduce power consumption.

8. The circuit of claim 1, wherein the digital compensator is coupled with a digital pulse width modulator to control a switch-mode power supplies (SMPS).

9. The circuit of claim 1, wherein difference in propagation of a clock signal through the reference delay line and the output measurement delay line is substantially independent of changes to the input voltage, $V_{ref}$.

10. The circuit of claim 1, wherein a zero error $b_{in}$ is larger than other quantization steps when there is a significant difference between $V_{ref}$ and converter output voltage to provide a non-linear gain characteristic.

* * * * *